SEMICONDUCTOR RESISTANCE ELEMENT

Filed Dec. 3, 1957 3 Sheets-Sheet 1

INVENTORS E. I. DOUCETTE
H. A. STONE, JR.
R. M. WARNER, JR.
BY [signature]
ATTORNEY

SEMICONDUCTOR RESISTANCE ELEMENT

Filed Dec. 3, 1957 3 Sheets-Sheet 2

INVENTORS E. I. DOUCETTE
H. A. STONE, JR.
R. M. WARNER, JR.
BY [signature]
ATTORNEY Sept. 27, 1960 E. I. DOUCETTE ET AL 2,954,486

SEMICONDUCTOR RESISTANCE ELEMENT

Filed Dec. 3, 1957 3 Sheets-Sheet 3

INVENTORS E. I. DOUCETTE
H. A. STONE, JR.
R. M. WARNER, JR.
BY H. W. Lockhart
ATTORNEY United States Patent Office 2,954,486

Patented Sept. 27, 1960

2,954,486

SEMICONDUCTOR RESISTANCE ELEMENT

Edward I. Doucette, New Providence, Henry A. Stone, Jr., Bernardsville, and Raymond M. Warner, Jr., Morris Plains, N.J., assignors to Bell Telephone Laboratories, Incorporated, New York, N.Y., a corporation of New York Filed Dec. 3, 1957, Ser. No. 700,319

13 Claims. (Cl. 307—88.5)

This invention relates to resistance elements and, more particularly, to a semiconductor P–N junction device useful as a passive circuit element.

The device of this invention is related in certain respects to the field effect transistors of the type disclosed in U.S. Patents 2,744,970, granted May 8, 1956, to W. Shockley, and 2,778,956, granted January 22, 1957, to G. C. Dacey and I. M. Ross, with certain important differences in structure and operation. However, because of this relationship and because it displays a nonlinear resistance characteristic, this device has been termed the "field effect varistor."

In its broadest aspects, the field effect varistor comprises a semiconductive body, for example, of germanium or silicon, having a substantially planar P–N junction therein and having only two terminals both of which are on the same side of the junction. Thus, the device of this invention differs from those semiconductor signal translating devices in which the current path penetrates the junction in that the current path is substantially parallel to the junction. It will be apparent also that the field effect varistor differs both structurally and functionally from prior field effect devices in that no external control or gate bias is provided.

Therefore, one basic object of this invention is a new and improved resistance element.

Another object is a stable resistance element having novel characteristics in electrical circuits.

In one specific form the device of this invention comprises a wafer of silicon having a single substantially planar P–N junction therethrough. Two substantially ohmic electrodes, termed the source and the drain, are attached separately to opposite ends of the P-type conductivity region. In this specific embodiment, the electrodes are confined to the P-type conductivity region, and the device therefore will exhibit a symmetrical voltage-current characteristic. In this context the symmetric structure is referred to also as nonpolar. It will be understood that for asymmetrical operation the source electrode is applied to the N-type region as well as to the P-type region to produce a polar structure. A groove or ditch across the P-type region of the wafer and between the source and drain electrodes produces a sharp reduction in the cross section of the P-type region. The flow of current from one electrode to the other is thereby restricted during a portion of its movement to a thin region close to the P–N junction. The voltage-current characteristics of the device are governed generally by the geometry of this restricted current channel as it is affected by encroachment of a space-charge region induced in the volume adjacent the P–N junction. Thus, the device exhibits a rise in current with increasing voltage until the boundary of the space-charge region meets the boundary of the groove or ditch across the wafer. From this condition increasing voltages serve to enlarge the space-charge region in the portion of the body beyond the groove or ditch and toward the drain electrode, while the part of the region toward the source electrode remains substantially unchanged. The boundary between this latter part of the space-charge region and the boundary of the groove or ditch defines a restricted current channel over the length of which the voltage drop remains substantially constant. Thus, the increase in applied voltage is absorbed almost entirely in the enlargement of a portion of the space-charge region, the current remaining substantially the same until a voltage is reached at which nondestructive breakdown occurs and the current rises sharply.

Therefore, one feature of this invention is a semiconductor resistance device having a P–N junction and only two electrodes both of which are on the same side of the junction.

A further feature of the device of this invention is a portion of restricted cross section between the two electrodes and in the conductivity type region to which the electrodes are common.

Another feature of this device is the nonlinear voltage-current characteristic which it exhibits and which includes two distinct and separately useful regions of current response to applied voltage. Thus, in one region the current response begins as near-ohmic but departs therefrom in nonlinear fashion. In the second region the current is substantially constant for a wide range of applied voltages.

The invention and the above-noted and other features thereof will be understood more clearly and fully from the following detailed description with reference to the accompanying drawing in which.

Figure 1:
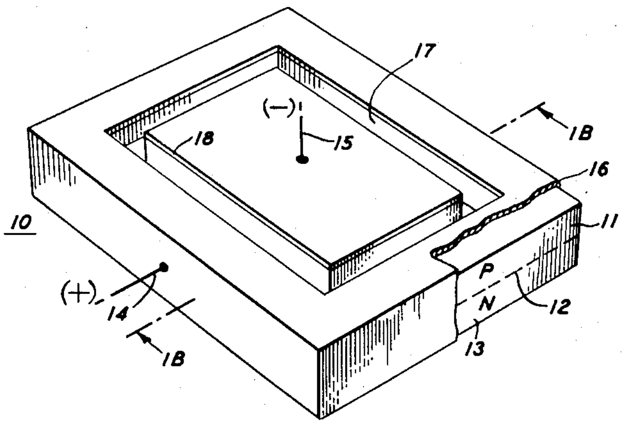
Fig. 1 is a perspective view partially in section of one embodiment of the device of this invention.
Figure 1B:
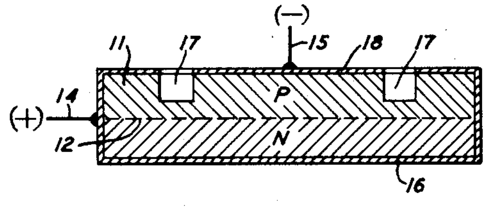
Fig. 1B is a sectional view of Fig. 1.

Referring to Figs. 1 and 1B, in one form a device in accordance with this invention comprises a wafer 10 of semiconductive material of single crystal silicon having an N-type region 11 and a P-type region 13 defining a P–N junction 12 therebetween. A moat or trench 17 is provided in the P-type region 11 and a gold-plating 16 and 18 enable attachment of a source electrode 14 and a drain electrode 15. In order to lend clarity to the exposition, the figures depicting the device structures are exaggerated in certain dimensions. Typically, the wafer of Fig. 1 may be a square of .090 inch on a side and having a thickness of about .012 inch. The upper portion 11 of the wafer to a depth of about .002 inch is converted to P-type conductivity to provide a P–N junction 12 within the wafer.

This conversion may be carried out advantageously by means of any one of a number of diffusion processes as disclosed in the applications of C. S. Fuller, Serial No. 414,272, filed March 5, 1954; Fuller-Tanenbaum, Serial No. 516,674, filed June 20, 1955; Derick-Frosch, Serial No. 477,535, filed December 24, 1954; and U.S. Patent 2,802,760 issued to L. Derick and C. J. Frosch August 13, 1957. Specifically, a slice cut from a single crystal of N-type conductivity silicon having a thickness of about .020 inch is placed in a sealed container and subjected to to a flow of boron pentoxide in a carrier gas at a temperature of 1275 degrees centigrade for about 24 hours. This treatment produces P-type conductivity layers .002 inch thick on both faces of the slice. After removing the slice from the container, the P-type layer on one face is removed by mechanical lapping or by etching. The slice is then cut into wafers of the dimensions set forth above. Each such wafer then will consist of a region 11 of P-type conductivity and a thicker region 13 of original N-type conductivity material, as shown in Fig. 1.

The wafer 10 is then cleaned and gold plated over its entire surface to a thickness of a few tenths of a mil. This plating is carried out either by electroplating techniques well-known in the art or by an electroless gold-plating method such as is disclosed in the application of J. F. Pudvin, Serial No. 632,228, filed January 2, 1957.

The trench 17, in the form of a band or border area, is next produced on the P-type conductivity face of the wafer. One advantageous method for producing the trench 17 is by means of ultrasonic cutting which penetrates the gold plating and a portion of the underlying silicon. The remainder of the material then is removed by the use of a suitable etchant, such as a dilute hydrofluoric acid solution, which attacks the silicon but not the gold. Alternatively, the removal of the border area of the gold plating on the P-type face may be accomplished by masking all but this area with a suitable wax and treating the masked wafer with aqua regia to remove the exposed gold plating. The wax mask is then removed and etching of the trench 17 is completed in the same manner as in the method set forth above. Generally, the trench has a width of about .004 inch and a total peripheral length of about .240 inch on the outside. Advantageously, the trench has a depth of .0019 inch so that its bottom approaches to within of the order of .0001 inch, but does not reach the P–N junction 12 within the wafer.

Finally, electrodes 14 and 15 are applied to the gold plating. The source electrode 14 is attached to the plating 16 which encloses both the N and P-type regions. The drain electrode 15 is applied to the central gold-plated area 18 which is confined to the P-type conductivity zone.

As has been noted briefly heretofore, the device of this invention may be characterized in terms of its current-voltage characteristic as having three regions of operation. These are denoted generally in the graph of Fig. 2 as region I, the pre-pinchoff characteristic; region II, the response during pinchoff; and region III, the post breakdown characteristic. The abscissae designated $V_p$ and $V_b$ denote the pinchoff and breakdown voltages, respectively.

Figure 3A:
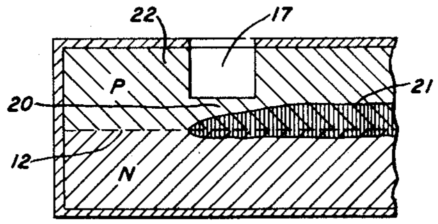
Figs. 3A, 3B and 3C are enlarged cross-section views of a portion of the device of Fig. 1 illustrating three conditions of operation.
Figure 3B:
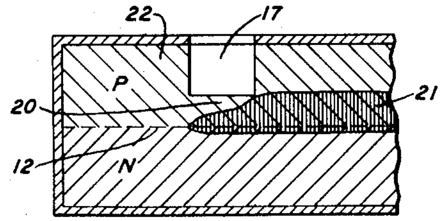
Figure 3C:
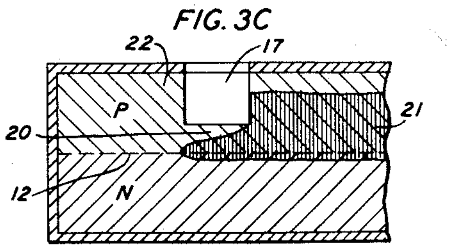

Referring to Figs. 3A, 3B and 3C, the operation of the device will be considered in more detail. Each of these figures represents a cross section of a portion of the device of Fig. 1 including a portion of the trench 17. As referred to briefly hereinbefore, the operation of the device is dependent to a considerable extent upon the geometry of the restricted channel 20 which in this device is provided between the bottom of the trench and the proximate portion of the P–N junction 12, as further affected by the space-charge or depletion region. In Figs. 3A, 3B and 3C the depletion layer is indicated by the shaded portion 21.

As is generally known in the art in connection with field effect semiconductor devices, the flow of current through the P-type material from the left to the right, that is, from the source electrode to the drain, will produce a voltage drop because of the resistance of the semiconductive material. In the structure shown this means that the potential will become more negative from left to right. This same potential will appear across the P–N junction because the P and N-type regions are connected at the source. The space-charge region or depletion layer 21 from which the mobile carriers have been withdrawn by this bias will be proportionate in thickness to the bias across the junction and, hence, the layer will grow larger as the center of the drain electrode 15 is approached. It will be understood that conduction occurs within the depletion layer only with the greatest difficulty because of the scarcity of mobile carriers. Thus, the extent of the depletion layer effectively controls the cross section of the current path 20 within the P-type region 22.

In Fig. 3A, which illustrates the condition which may exist during the pre-pinchoff operation of the device, the depletion layer 21 is shown as extending a little more than half-way across the channel between the junction and the bottom of the trench. The depletion layer on the N-type side will be very thin if the material has a heavy concentration of donor atoms. Thus, in the pre-pinchoff region the current rise occurs at first, in a near-ohmic manner but then decreases, as depicted by region I of the graph, until the pinchoff voltage $V_p$ is reached.

Referring to Fig. 3B, the extent of the depletion layer 21 is shown at the pinchoff voltage $V_p$ as just contacting a boundary of the trench 17 and with a further increase in voltage it is evident that the current is swept through at least a portion of the depletion layer. Under the condition as shown in Figs. 3B and 3C, the depletion layer 21 enlarges in extent, and increases in the applied voltage produce but very slight increases in current passed by the device. Thus, the device exhibits a region, designated in the graph of Fig. 2 as II, in which a substantially flat linear current characteristic is exhibited over a considerable range of voltage. In a typical device of the configuration of Fig. 1, the pinchoff point $V_p$ occurs at 25 volts and 5 milliamperes and the breakdown point at 150 volts and 5½ milliamperes. The region III beyond the point of nondestructive breakdown $V_b$ is analogous to that which occurs in avalanche breakdown devices of the type disclosed in U.S. Patent 2,790,034 issued to K. B. McAfee, Jr. April 23, 1957.

Figure 2:
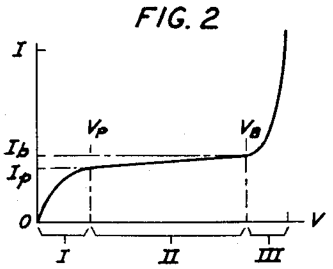
Fig. 2 is a graph of the voltage-current characteristic of the device of Fig. 1.
Figure 4:
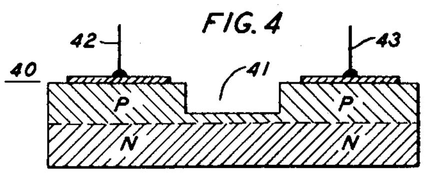
Fig. 4 is a sectional view of another embodiment of the invention.
Figure 5:
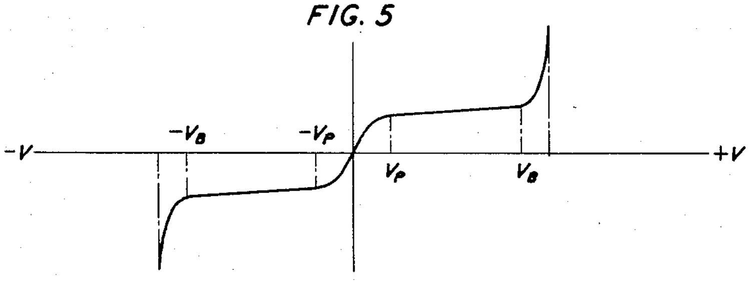
Fig. 5 is a graph of the voltage-current characteristic of the device of Fig. 4.

Although the device of this invention has been described in Figs. 1, 2 and 3 in terms of a polar or nonsymmetric structure in which the source electrode is common to both conductivity type regions, the invention may be produced in a nonpolar or symmetric structure in which the source electrode as well as the drain electrode is attached only to a single conductivity type region. A nonpolar or symmetric structure in accordance with this invention is illustrated in Fig. 4 which, similarly to the device of Fig. 1, may comprise a wafer 40 of single crystal silicon .090 inch square and having comparable thickness dimensions. In the device of Fig. 4, a trench 41 is etched entirely across one face of the device, and source and drain electrodes 42 and 43 are attached to the P-type region on opposite sides of the trench. Operation of the device of Fig. 4 is similar to that of the polar structure of Fig. 1 insofar as the configuration of the space-charge region is concerned. Because the source electrode is not common to both regions, a small portion of the P–N junction closest to the source electrode will be forward biased and some injection of majority carriers will occur therethrough. The forward biased portion of the junction carries a current just equal to the current flowing across the remainder of the junction which is reverse biased. The primary advantage of the symmetric field effect varistor structure resides in its ability to operate in both directions of applied potential. Thus, as is depicted in the graph of Fig. 5, the device of Fig. 4 exhibits a reverse characteristic substantially the image of the forward characteristic. The designation of the points $\pm V_p$ and $\pm V_b$ will be understood to have the same connotation as previously noted in connection with the graph of Fig. 2.

Figure 6:
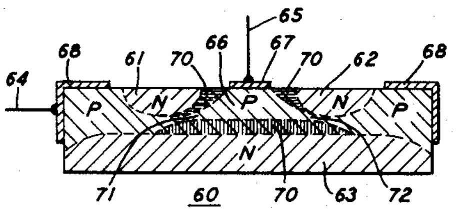

Fig. 6 illustrates another embodiment of the invention in a device having active P–N junctions as boundaries for the restricted current channels.

On one face of the wafer 60, regions 61 and 62 represent in cross section a generally rectangular continuous N-type conductivity layer. It will be noted that this N-type region conforms substantially to the volume represented by the trench 17 of Fig. 1. Another N-type conductivity region 63 is formed entirely across the opposite face of the wafer. The source electrode 64 is attached to the plated area 68 on the P-type conductivity region 66. The drain electrode 65 is applied to the centrally located plated area 67.

The device of Fig. 6 may be constructed from a P-type conductivity wafer comparable in dimensions to the wafer of Fig. 1 and in which N-type conductivity regions are produced by first masking and then diffusing suitable donor impurities in accordance with techniques well-known to those skilled in the art. For example, a method of producing a structure of similar complexity is disclosed in J. Andrus, Serial No. 537,455, filed September 29, 1955. Typically, the thickness of the restricted current channels 71 and 72 separating the opposing N-type conductivity zone may be of the order of .0002 inch.

It will be noted that the device of Fig. 6 is of nonpolar or symmetric configuration in which the source electrode 64 is confined to the P-type conductivity region 66. The extent of the depletion layers just prior to pinchoff is indicated by the shaded areas 70 extending out from the P–N junctions into the P-type region 66 and toward the drain electrode 65. Thus, there are two pinchoff regions 71 and 72 bounded by two P–N junctions rather than by one P–N junction and a free surface as is the case in the structures of Figs. 1 and 4. The double-junction structure, represented by the embodiment of Fig. 6, is most advantageous from the standpoint of device stability. Because the restricted current channels are bounded on both sides by active junctions, they are thus within the device and not subject to the possibility of surface inversion layers produced by contamination or moisture. In the case of the embodiments of Figs. 1 and 4, for example, it is usually necessary to provide some control or protection of the ambient over the area represented by the boundary of the trench or groove across the device.

Figure 7:
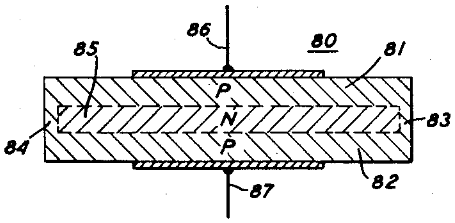
Figs. 6, 7 and 9 are other embodiments of the invention.

Fig. 7 illustrates a further embodiment of the invention in a structure which lends itself to ready fabrication by diffusion processes well-known in the art. For example, the device 80 of Fig. 7 may be fabricated from a wafer of N-type conductivity silicon which has a masking agent applied to the periphery thereof so as to prohibit or substantially inhibit diffusion. The wafer then is subjected to a gaseous diffusion process to produce the P-type layers 81 and 82 on the opposite faces of the wafer, which may be followed by a shorter term diffusion to produce the very thin P-type layers 83 and 84 around the periphery. Alternatively, this peripheral diffusion may occur during the primary diffusion if an inhibiting mask rather than an absolute mask is applied to the periphery. Such preferential diffusion techniques are disclosed in the above-noted patent of Derick and Frosch. The structure shown in Fig. 7 is of the nonpolar type having electrodes 86 and 87 which are confined to the P-type region.

Figure 8:
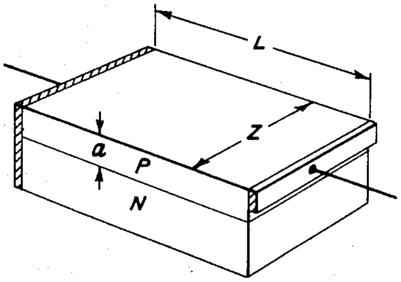
Fig. 8 is a schematic representation of the device of this invention.

It will be apparent that a most advantageous mode of operation of the device occurs in the pinchoff region from $V_p$ to $V_b$. Referring to Fig. 8, it can be shown that the pinchoff current depends directly upon the width Z of the channel and inversely upon the length L, while the pinchoff voltage is independent of these parameters. Thus, it is important to have a high ratio of channel width to channel length in order to achieve a satisfactory high ratio of pinchoff current to pinchoff voltage.

Figure 9:
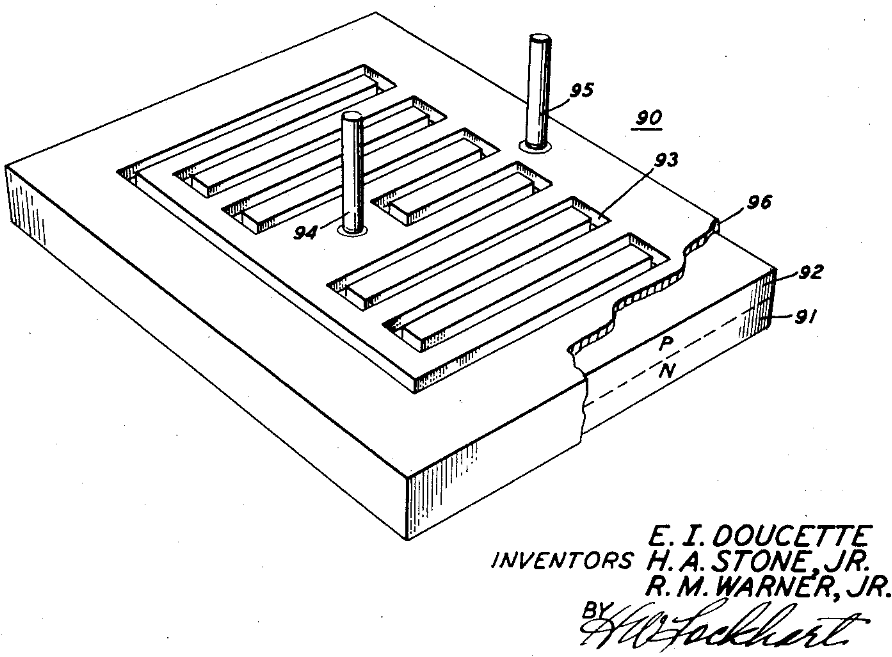

A structure which illustrates the inflation of this ratio is shown in Fig. 9. This device 90 is similar in basic arrangement to the device shown in Fig. 1, with the difference, however, that the trench 93 is provided in the shape of a comb. In this arrangement the circuitous length of the trench 91 represents the width Z of the channel and, from a practical standpoint, is substantially a maximum for the area involved. The device 90 of Fig. 9 may be fabricated readily by masking and diffusing techniques hereinbefore noted to produce a P-type layer 92 on the original N-type material 91. Source and drain electrodes 95 and 94 are attached by means of a surface plating 96.

Figure 10:
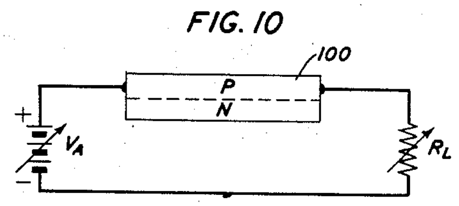
Figs. 10 and 11 are diagrams illustrating circuit applications of the invention.

As will be apparent from the foregoing discussion of the characteristics of the device of this invention, it has certain particularly advantageous applications. Fig. 10 illustrates diagrammatically a simple and idealized circuit showing a variable direct-current potential $V_a$ applied to a variable resistance load through a field effect varistor. Referring again to the graph of Fig. 2, the field effect varistor will maintain the current between $I_p$ and $I_b$ for a wide range of fluctuation in the applied voltage $V_a$ and changes in the load resistance $R_L$ provided that these do not depart from the limits defined by $V_p$ and $V_b$. Thus, the field effect varistor in this circuit application serves as a stabilizing element or current regulator.

Figure 11:
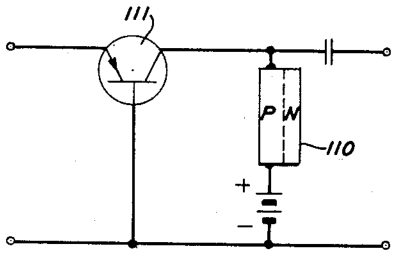
Figure 12:
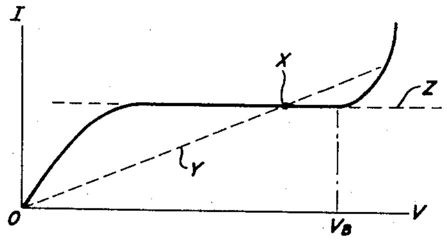
Fig. 12 is a graph of the voltage-current characteristic in connection with the diagram of Fig. 11.

In the amplifier circuit of Fig. 11 a field effect varistor 110 is shown in the collector bias supply of a transistor 111. The usefulness of the field effect varistor in this application resides in its nonlinear resistance characteristic whereby the device displays a higher alternating-current impedance than direct-current resistance. The basis for this property is illustrated by reference to the graph of Fig. 12 in which the solid curve depicts the current-voltage characteristic. At any given operating point the direct-current resistance is inversely proportional to the slope of a straight line from the origin intersecting the point. The alternating-current impedance, on the other hand, is inversely proportional to the slope of the current-voltage characteristic at the point in question. That is, for the operating point X the direct-current resistance is inversely proportional to the slope of the dotted line Y and the alternating-current impedance is similarly related to the slope of the dotted line Z. Because the slope of the characteristic curve below the breakdown voltage $V_b$ is always less than the slope of the straight line through the origin and the operating point, the alternating-current impedance is always greater than the direct-current resistance. Furthermore, this characteristic is substantially independent of frequency which further enhances the field effect varistor as a coupling element as shown in Fig. 11.

The field effect varistor is also useful as a current limiting device when designed to operate at voltages below the pinchoff voltage. As noted hereinbefore in connection with the graph of Fig. 2, at voltages below pinchoff the device exhibits an approximately ohmic characteristic. In the event of a large voltage pulse of reasonable duration, operating conditions in excess of $V_p$ would be realized and the current limiting action of the field effect varistor would attenuate this signal. The current limiting action, of course, ceases if the voltage exceeds the breakdown value $V_b$.

Other uses taking advantage of the novel characteristics of the field effect varistor will be apparent to those skilled in the art. For example, the variation in the level of the alternating-current impedance in the three regions I, II, and III of the graph of Fig. 2 from a relatively low value to a high and back to a low impedance suggests its use as a "switch."

It is to be understood that the specific embodiments of the invention shown and described are but illustrative and that various modifications may be made therein without departing from the scope and spirit of the invention. For example, other geometries and configurations of semiconductive material and electrodes are possible. In addition, although the specific embodiments disclosed herein depict the current channel in P-type conductivity material, it is to be understood that the current channel region may be of N-type conductivity requiring, as a consequence, merely a reversal of polarities in the polar or asymmetric form of the device.

What is claimed is:

1. A two-terminal nonlinear resistance element comprising a semiconductive body having a first region of one conductivity type and a second region of opposite conductivity type, said first and second regions defining a P–N junction therebetween, a first low resistance connection contacting said body at least over a portion of said first region, and a second low resistance connection contacting only a portion of said first region and spaced from said first connection by a volume defining the length, width and thickness of the current path between said connections, said volume having a width dimension transverse to the current path large in comparison to the length and thickness dimensions of said volume, said body being free of any other connections.

2. A two-terminal nonlinear resistance element comprising a semiconductive body having a first region of one conductivity type and a second region of opposite conductivity type, said first and second regions defining a P–N junction therebetween, a first low resistance connection contacting said body at least over a portion of said first region, and a second low resistance connection contacting only a portion of said first region and spaced from said first connection, said first region having a portion of reduced cross section between said first and second connections, said body being free of any other connections.

3. A two-terminal nonlinear resistance element comprising a semiconductive body having a first region of one conductivity type and a second region of opposite conductivity type, said first and second regions defining a substantially planar junction therebetween, a first low resistance connection contacting said body at least over a portion of said first region, and a second low resistance connection contacting only a portion of said first region and spaced from said first connection, said first region having a portion of reduced cross section between said first and second connections, said body being free of any other connections.

4. A two-terminal nonlinear resistance element comprising a semiconductive body having a first region of one conductivity type and a second region of opposite conductivity type, said first and second regions defining a substantially planar P–N junction therebetween, a first low resistance connection contacting only a portion of said first region, and a second low resistance connection contacting only another portion of said first region, said first region having a portion of reduced cross section between said first and second connections, said body being free of any other connections.

5. A two-terminal nonlinear resistance element comprising a semiconductive body having a first region of one conductivity type and a second region of opposite conductivity type, said first and second regions defining a substantially planar P–N junction therebetween, a first low resistance connection contacting a portion of both first and second regions and a second low resistance connection contacting only a portion of said first region spaced from said first connection by a volume defining the length, width and thickness of the current path between said connections, said volume having a width dimension transverse to the current path large in comparison to the length and thickness dimensions of said volume, said body being free of any other connections.

6. A two-terminal nonlinear resistance element comprising a semiconductive wafer having a substantially planar transverse junction therethrough, said wafer having a portion on one side of said junction of one conductivity type and the portion on the other side of the junction of the opposite conductivity type, said portion of said one conductivity type having a trench thereacross approaching but not penetrating to said junction, and a pair of low resistance connections to said region of said one conductivity type on opposite sides of said trench, said wafer being free of any other connections.

7. A two-terminal nonlinear resistance element comprising a semiconductive wafer having a first region of one conductivity type across one face of said wafer and a second region of opposite conductivity type across the other face of said wafer, said first and second regions defining a substantially planar P–N junction within said wafer, said first region having a continuous trench symmetrically disposed in the face thereof, said trench having a boundary approaching but not intersecting said junction, a first source electrode connected to said second region and to that portion of said first region peripheral to said trench, and a second or drain electrode connected to the central portion of said first region bounded by said trench, said wafer being free of any other electrodes.

8. A two-terminal nonlinear resistance element comprising a substantially rectangular semiconductive wafer having a first region of one conductivity extending inwardly from said one face of said wafer and a second region of opposite conductivity type extending from the other face of said wafer, said regions defining a substantially planar P–N junction therebetween, said first region having a substantially rectangular trench symmetrically disposed in said one face, said trench having a depth approaching but not intersecting said junction, a first source electrode applied to said wafer over the portions outside of said trench, and a second drain electrode attached to the central portion of said one face bounded by said trench, said wafer being free of any other electrodes.

9. A two-terminal nonlinear resistance element comprising a semiconductive wafer having a first region of one conductivity type centrally disposed within said wafer, a second region of opposite conductivity type entirely surrounding said first region including a peripheral portion of reduced cross section, and a pair of low resistance connections contacting said second region at points on opposite sides of said portion of reduced cross section, said wafer being free of any other connections.

10. A two-terminal nonlinear resistance element comprising a semiconductive wafer having a first region of one conductivity type and second regions of opposite conductivity type disposed on opposite faces of said wafer, said second regions defining a portion of reduced cross section therebetween in said first region and a pair of low resistance connections to said first region at points on opposite sides of said portion of reduced cross section, said wafer being free of any other connections.

11. In combination, a two-terminal nonlinear resistance element in accordance with claim 1 which, for applied voltages less than a critical breakdown voltage, is characterized by a substantially constant current region, and, in series circuit relation therewith, a source of varying voltage less than said critical breakdown voltage, and a load element.

12. In combination, a two-terminal nonlinear resistance element in accordance with claim 2 which, for applied voltages less than a critical breakdown voltage, is characterized by a substantially constant current region, and, in series circuit relation therewith, a potential source whose amplitude is subject to variation within a range not exceeding said critical breakdown voltage, and a load element.

13. In combination, a two-terminal nonlinear resistance element in accordance with claim 3 which, for applied voltages less than a critical breakdown voltage, is characterized by a substantially constant current region, and, in series circuit relation therewith, a source of voltage less than the critical breakdown voltage, and a load element having a varying resistance component.

References Cited in the file of this patent

UNITED STATES PATENTS

| | | |
|---|---|---|
| 2,502,479 | Pearson et al. | Apr. 4, 1950 |
| 2,560,594 | Pearson | July 17, 1951 |
| 2,697,052 | Dacey et al. | Dec. 14, 1953 |
| 2,744,970 | Shockley | May 8, 1956 |
| 2,805,347 | Haynes et al. | Sept. 3, 1957 |
| 2,874,341 | Biondi et al. | Feb. 17, 1959 |